US008462028B2

(12) United States Patent
Kashiwakura

(10) Patent No.: US 8,462,028 B2
(45) Date of Patent: Jun. 11, 2013

(54) PARALLEL TO SERIAL CONVERSION APPARATUS AND METHOD OF CONVERTING PARALLEL DATA HAVING DIFFERENT WIDTHS

(75) Inventor: Shoichiro Kashiwakura, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 88 days.

(21) Appl. No.: 13/176,358

(22) Filed: Jul. 5, 2011

(65) Prior Publication Data

US 2012/0007755 A1    Jan. 12, 2012

(30) Foreign Application Priority Data

Jul. 6, 2010 (JP) .................................. 2010-153529

(51) Int. Cl.
*H03M 9/00* (2006.01)

(52) U.S. Cl.
USPC ................. 341/101; 348/58; 348/63; 348/94; 348/95; 375/260; 375/320; 375/298; 375/284; 375/346; 341/100; 341/103

(58) Field of Classification Search
USPC ..... 341/50–103; 348/58, 63, 94, 95; 375/260, 375/261, 264, 267, 298, 320, 341, 295
See application file for complete search history.

(56) References Cited

U.S. PATENT DOCUMENTS

| 6,084,536 | A  | * | 7/2000  | Arts ................................. 341/58 |
| 6,307,889 | B1 | * | 10/2001 | Chun ............................. 375/260 |
| 6,680,681 | B1 | * | 1/2004  | Hsu et al. ...................... 341/144 |
| 6,693,836 | B2 | * | 2/2004  | Keeth et al. .................... 365/221 |
| 7,046,869 | B2 | * | 5/2006  | Bryson ............................ 385/14 |
| 7,124,334 | B2 | * | 10/2006 | Kashiwakura ................ 714/712 |
| 7,253,743 | B2 |   | 8/2007  | Liang et al. |
| 7,253,754 | B2 |   | 8/2007  | Takeuchi et al. |
| 8,295,398 | B2 | * | 10/2012 | Fan et al. ....................... 375/298 |

FOREIGN PATENT DOCUMENTS

| JP | A-08-065173  | 3/1996 |
| JP | A-2002-009629 | 1/2002 |

* cited by examiner

*Primary Examiner* — Lam T Mai
(74) *Attorney, Agent, or Firm* — Oliff & Berridge, PLC

(57) ABSTRACT

Various exemplary embodiments of this disclosure provide parallel to serial conversion apparatuses that includes a bit-swapping circuit that generates bit-swapped parallel data by swapping bits of input parallel data, and a parallel to serial conversion circuit that acquires M1 and M2 bits of the bit-swapped parallel data in a first and a second mode, respectively. The parallel to serial conversion circuit generates serial data by arranging the acquired bits of the bit-swapped parallel data in a first specified order in the first mode and in a second specified order in the second mode The bit-swapping circuit swaps the bits of the input parallel data such that the parallel to serial conversion circuit acquires 1st to M1-th and 1st to M2-th bits of the input parallel data in the first and second modes, respectively, and arranges the acquired bits of the input parallel data in the same order.

20 Claims, 9 Drawing Sheets

PARALLEL TO SERIAL CONVERSION APPARATUS AND METHOD OF CONVERTING PARALLEL DATA HAVING DIFFERENT WIDTHS

The application claims benefit of Japanese Application No. JP-A-2010-153529. The disclosure of the prior application is hereby incorporated by reference in its entirety.

BACKGROUND

This invention relates to parallel to serial conversion apparatuses that may be used in, for example, high-speed serial communications.

In the field of high-speed serial communications, it is conventional to perform various digital signal processing on low-speed parallel data and, then, convert the processed parallel data to high-speed serial data before transmitting the data to a transmission line. Thereby, the various digital signal processing can be easily performed.

Various types of parallel to serial conversion apparatus are known. For example, Japanese laid-open patent JP 8-65173 (Patent document 1) discloses a type of parallel to serial conversion apparatus constructed with a shift-register. Japanese laid-open patent JP 2002-9629 (Patent document 2) discloses a tree-type parallel to serial conversion apparatus. That is, a plurality of 2:1 parallel to serial conversion circuits, or unit conversion circuits, is arranged in a form of a tree having a plurality of stages.

On the other hand, FIG. 13 of U.S. Pat. No. 7,253,754 (Patent document 3) shows a parallel-serial converter that converts parallel data having a width determined by a dividing ratio setting signal.

Conversion apparatuses disclosed in Patent documents 1 or 3 requires high-speed shift registers that operate at an output frequency. Accordingly, especially when serializing parallel data having wide widths, circuitry that operates at a high-speed increases and the layout design becomes difficult. The conversion apparatus disclosed in Patent document 2 includes circuitry that operates at a high-speed only in the 2:1 multiplexer just before the output. Accordingly, layout design becomes easy and the power consumption decreases. However, a parallel to serial conversion ratio is fixed to $2^n$, where n is a positive integer.

FIG. 18 of Patent document 3 proposes to utilize the tree-type structure disclosed in Patent document 2 in high-speed operating portions while utilizing the shift-register structure in remaining portions. Thereby, problems caused by the high-speed operation can be solved. However, Patent document 3 only provides a parallel to serial conversion apparatus that converts input parallel data having a fixed width determined by the dividing ratio setting signal. It does not provide a parallel to serial conversion apparatus that can select the width of input parallel data.

SUMMARY

It would be advantageous to provide parallel to serial conversion apparatuses that can select the width of input parallel data from two or more widths without loosing high-speed operation capability.

This disclosure provides parallel to serial conversion apparatuses that include a bit-swapping circuit that generates bit-swapped parallel data by swapping bits of input parallel data and a parallel to serial conversion circuit that generates serial data by acquiring and arranging bits of the bit-swapped parallel data. This disclosure further provides methods of converting parallel data to serial data that include generating bit-swapped parallel data and generating serial data by acquiring and arranging bits of the bit-swapped parallel data. Combination of the swapping and the arranging enables to convert input parallel data having two or more selectable widths to serial data by arranging bits of the input parallel data in the same order. Specifically, a tree-type parallel to serial conversion circuit having high-speed and low-power operation capability may be utilized for converting parallel data with different widths.

Various exemplary embodiments of this disclosure provide parallel to serial conversion apparatus having a first and a second mode. The parallel to serial conversion apparatuses includes a bit-swapping circuit that receives bits of input parallel data from parallel input terminals and generates bit-swapped parallel data by swapping the bits of the input parallel data, and a parallel to serial conversion circuit having internal input terminals that receives respective bits of the bit-swapped parallel data. The parallel to serial conversion circuit acquires M1 bits of the bit-swapped parallel data received at M1 of the internal input terminals in the first mode and M2 bits of the bit-swapped parallel data received at M2 of the internal input terminals in the second mode, where each of M1 and M2 is an integer and $2 \leq M2 < M1$. The parallel to serial conversion circuit generates serial data by arranging the acquired bits of the bit-swapped parallel data in a first specified order in the first mode and in a second specified order, different from the first specified order, in the second mode. Further, the bit-swapping circuit swaps the bits of the input parallel data in a first way in the first mode and in a second way, different from the first way, in the second mode such that the parallel to serial conversion circuit acquires 1st to M1-th and 1st to M2-th bits of the input parallel data in the first and second modes, respectively, and arranges the acquired bits of the input parallel data in a same order independent of the modes.

According to some exemplary embodiments, the parallel to serial conversion circuit may include 1st to n-th stages each including $2^{n-k}$ unit conversion circuits, where n is an integer greater than 1 and $M1 \leq 2^n$, and k=1, 2, 3, ..., n. Each of the unit conversion circuits in the 1st to n−1-th stages receives two of the bits of the bit-swapped parallel data and supplies one of the received bits to a next one of the stages and the unit conversion circuit in the n-th stage receives two of the bits of the bit-swapped parallel data and supplies one of the received bits to an output terminal that outputs the serial data in synchronous with a clock signal.

Various exemplary embodiments of this disclosure provide parallel to serial conversion apparatuses that includes a bit-swapping circuit, a parallel to serial conversion circuit, and a parallel-data-width setting circuit that receives a clock signal having a clock cycle and a mode-setting signal. The bit-swapping circuit receives bits of input parallel data from parallel input terminals and generates bit-swapped parallel data by swapping the bits of the input parallel data. The parallel-data-width setting circuit generates a processing signal to be supplied to the parallel to serial conversion circuit such that the processing signal has a processing cycle equal to one of M1 and M2 times the clock cycle determined in accordance with a value of the mode-setting signal, where each of M1 and M2 is an integer and $2 \leq M2 < M1$. Further, the parallel to serial conversion circuit acquires M1 or M2 bits of the bit-swapped parallel data and outputs the acquired bits in a specified order in accordance with the processing cycle from an output terminal in synchronous with the clock signal as serial data. The bit-swapping circuit swaps the bits of the input parallel data in accordance with the value of the mode-setting signal such that, by acquiring the M1 or M2 bits of the bit-swapped parallel data and outputting the acquired bits in the specified order, the parallel to serial conversion circuit acquires 1st to M1-th or M2-th bits of the input parallel data and outputs the acquired bits of the input parallel data in a same order independent of the value of the mode-setting signal from the output terminal.

Various exemplary embodiments of this disclosure provide methods of converting parallel data to serial data that include receiving a mode-setting signal having one of a first and a second value, receiving bits of input parallel data from parallel input terminals and generating bit-swapped parallel data by swapping the bits of the input parallel data, and receiving bits of the bit-swapped parallel data from respective internal input terminals of a parallel to serial conversion circuit. The parallel to serial conversion circuit generates serial data by (1) acquiring M1 bits of the bit-swapped parallel data received from M1 of the internal input terminals and arranging the acquired bits of the bit-swapped parallel data in a first specified order when the mode-setting signal has the first value and (2) acquiring M2 bits of the bit-swapped parallel data received from M2 of the internal input terminals and arranging the acquired bits of the bit-swapped parallel data in a second specified order, different from the first specified order, when the mode-setting signal has the second value, where each of M1 and M2 is an integer and 2 M2<M1. Further, the swapping swaps the bits of the input parallel data in a first way when the mode-setting signal has the first value and in a second way, different from the first way, when the mode-setting signal has the second value, such that the parallel to serial conversion circuit acquires 1st to M1-th and 1st to M2-th bits of the input parallel data when the mode-setting signal has the first and second values, respectively, and arranges the acquired bits of the input parallel data in a same order independent of the value of the mode-setting signal.

Various exemplary embodiments of this disclosure provides methods of converting parallel data to serial data that include receiving bits of input parallel data from parallel input terminals and generating bit-swapped parallel data by swapping the bits of the input parallel data, and receiving a clock signal having a clock cycle and a mode-setting signal and generating a processing signal to be supplied to a parallel to serial conversion circuit such that the processing signal has a processing cycle equal to one of M1 and M2 times the clock cycle determined in accordance with a value of the mode-setting signal, where each of M1 and M2 is an integer and 2≦M2<M1. The methods further includes acquiring M1 or M2 bits of the bit-swapped parallel data in the parallel to serial conversion circuit and outputting the acquired bits in a specified order in accordance with the processing cycle from an output terminal in synchronous with the clock signal as serial data. Further, the swapping is performed in accordance with the value of the mode-setting signal such that, by acquiring the M1 or M2 bits of the bit-swapped parallel data and outputting the acquired bits in the specified order, the parallel to serial conversion circuit acquires 1st to M1-th or M2-th bits of the input parallel data and outputs the acquired bits of the input parallel data in a same order independent of the value of the mode-setting signal from the output terminal.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

First Embodiment

Figure 1:
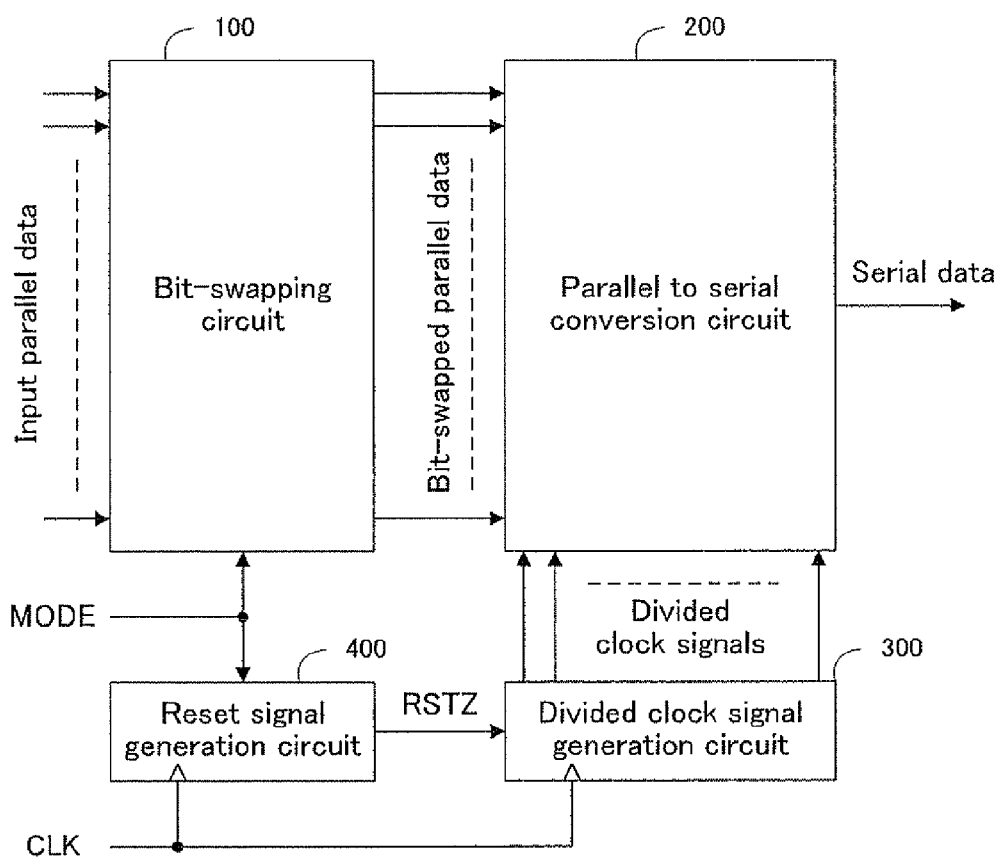
FIG. 1 is a functional block diagram of an exemplary parallel to serial conversion apparatus according to first exemplary embodiment of this disclosure.
Figure 2:
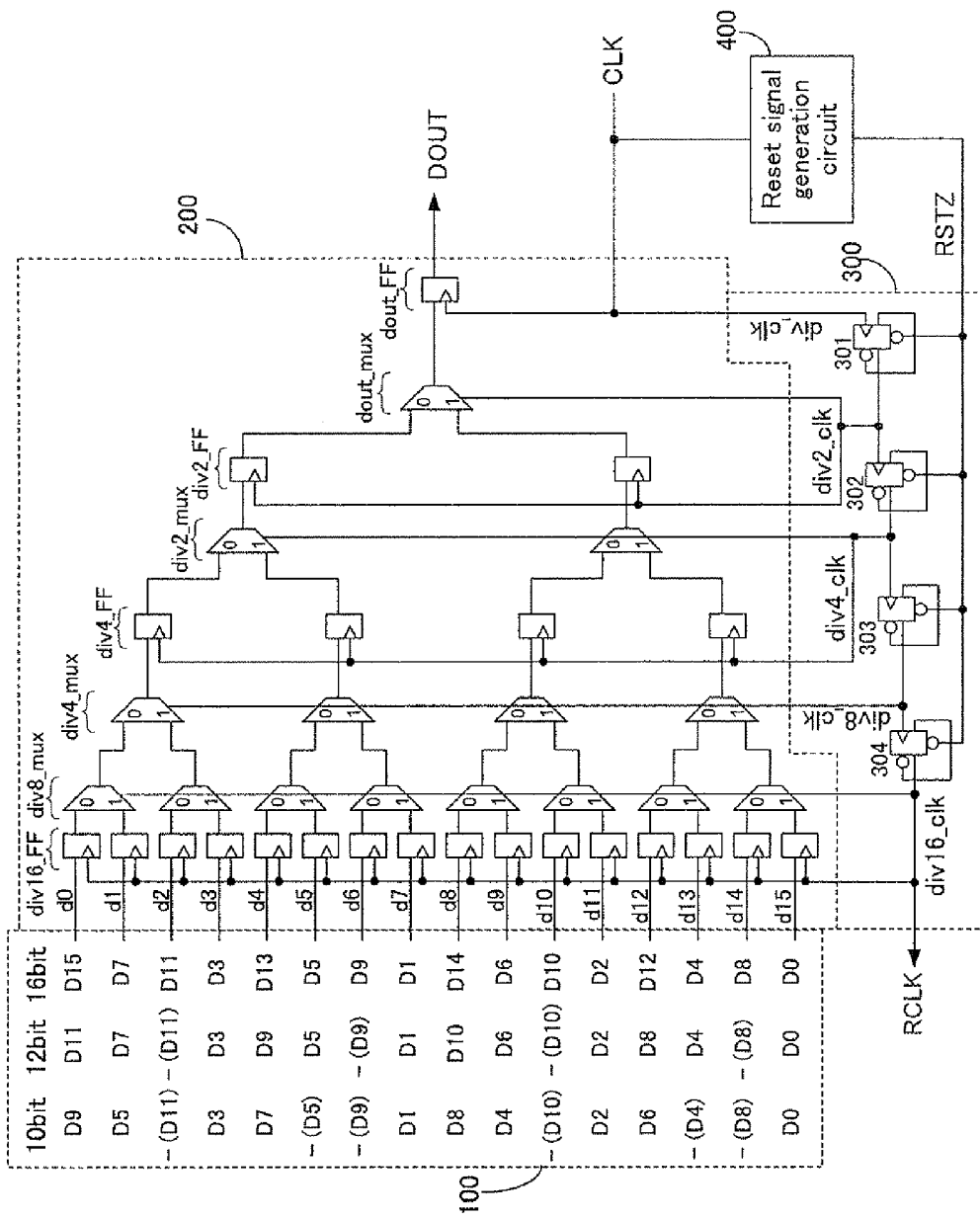
FIG. 2 is an exemplary circuit diagram of parallel to serial conversion apparatus according to the first exemplary embodiment.

FIG. 1 shows a schematic block diagram, and FIG. 2 shown a circuit diagram, of an exemplary parallel to serial conversion apparatus according to first exemplary embodiment of this disclosure.

The exemplary parallel to serial conversion apparatus shown in FIG. 1 includes a bit-swapping circuit 100, a parallel to serial conversion circuit 200, divided clock signal generation circuit 300, and a reset signal generation circuit 400. The bit-swapping circuit 100 changes the bit-order of input parallel data by swapping at least some of the bits of the input parallel data and generates bit-swapped parallel data. The parallel to serial conversion circuit 200 converts the bit-swapped parallel data to serial data. The divided clock signal generation circuit 300 divides input clock signal CLK to generate a plurality of divided clock signals and supplies the divided clock signals to the parallel to serial conversion circuit 200. The reset signal generation circuit 400 generates reset signal RSTZ that resets the divided clock signal generation circuit 300 at a cycle in accordance with the width of input parallel data, or at every specified number of clock cycles required to convert the parallel data.

In the exemplary parallel to serial conversion apparatus, the divided clock signal generation circuit 300 and the reset signal generation circuit 400 constitute a parallel-data-width setting circuit that sets the width of parallel data. That is, the divided clock signal generation circuit 300 and the reset signal generation circuit 400 generates the divided clock signals that are reset at the cycle required to convert parallel data having the width. The parallel to serial conversion circuit 200 performs the parallel to serial conversion process by using the divided clock signals supplied from the divided clock signal generation circuit 300 as processing signals.

The bit-swapping circuit changes the bit-order of parallel data in accordance with the width of the input parallel data. Thereby, the exemplary parallel to serial conversion apparatus can generate serial data in which bits of input parallel data are arranged in a fixed order independent of the width of parallel data.

Figure 3:
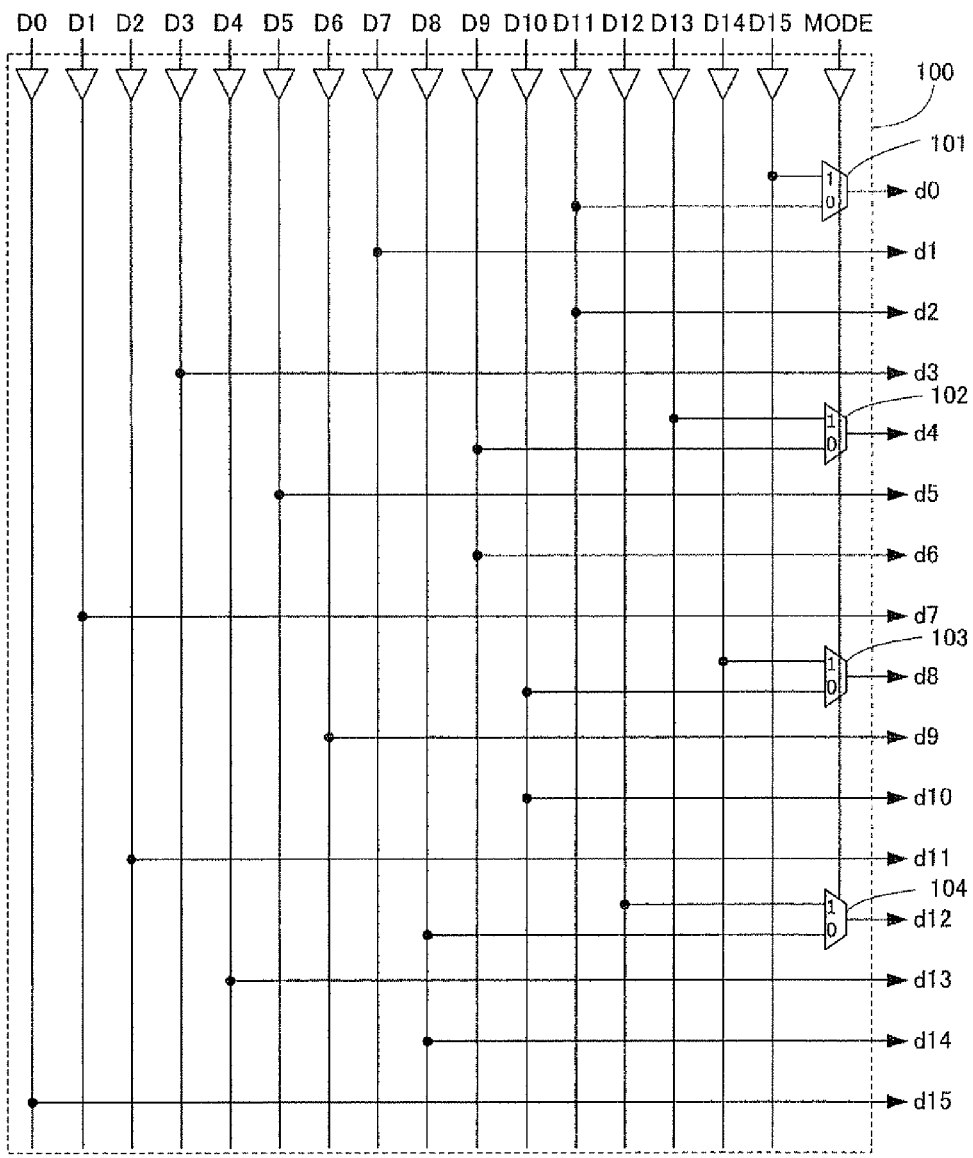
FIG. 3 is an exemplary circuit diagram of the bit-swapping circuit for input parallel data widths of 16/12 bits according to the first exemplary embodiment.

Specifically, the bit-swapping circuit 100 of the exemplary parallel to serial conversion apparatus changes the bit-order of the parallel data as schematically shown in FIG. 2 when the bit-widths of the parallel data are 10, 12, and 16 bits, respectively. FIG. 3 shows exemplary construction of the bit-swapping circuit 100 for 16/12-bit parallel data widths. The bit-swapping circuit 100 receives bits of parallel data at parallel input terminals D0 to D15 and outputs bit-swapped parallel data from output terminals d0 to d15. The bit-swapping circuit 100 further receives a mode-setting signal MODE.

As shown in FIG. 3, the exemplary bit-swapping circuit 100 has interconnections between the input terminals D0 to D15 to corresponding output terminals d0 to d15. The exemplary bit-swapping circuit 100 further includes four multiplexers 101 to 104. Each of the multiplexers 101 to 104 receives bits from two of the input terminals D0 to D15 and outputs one of them to a corresponding one of the output terminals d0 to d15.

In the 16-bit mode where the width of input parallel data is 16 bits, the value of the mode-setting signal MODE=1. As a result, each of the multiplexers 101 to 104 selects a bit input to the input marked as "1". Thereby, correspondences between the input terminals D0 to D15 and the output terminals d0 to d15 marked as "16 bit" in FIG. 2 are formed. In the 12-bit mode where the width of input parallel data is 12 bits, on the other hand, the value of the mode-setting signal MODE=0. As a result, each of the multiplexers 101 to 104 selects a bit input to the input marked as "0". Thereby, correspondences between the input terminals D0 to D15 and the output terminals d0 to d15 marked as "12 bit" in FIG. 2 are formed.

In the 12-bit mode, data input to the input terminals D12 to D15 are invalid, and do not output to any of the output terminals d0 to d15. Further, data at the output terminals d2, d6, d10, and d14 becomes invalid. That is, these output terminals outputs bits of the input parallel data that are also output to the output terminals d0, d4, d8, and d12 through the multiplexers 101 to 104. The parallel to serial conversion circuit 200 that processes the bit-swapped parallel data in accordance with the divided clock signals generates serial data by acquiring the bits output from the output terminals d0, d4, d8, and d12.

Accordingly, in the 12-bit mode, the parallel to serial conversion circuit 200 acquires the bits received at 12 of the 15 output terminals, i.e., output terminals d0, d1, d3, d4, d5, d7, d8, d9, d11, d12, d13, and d15. Note that, in the 16-bit mode, the parallel to serial conversion circuit 200 acquires the bits received at the input terminals including these 12 output terminals. However, some of these 12 output terminals correspond to different input terminals in different modes. For example, the output terminal d0 corresponds to the input terminal D11 in the 12-bit mode, but corresponds to the input terminal D15 in the 16-bit mode. Similarly, the output terminals d4, d8, and d12 correspond to the input terminals D9, D10, and D8, respectively, in the 12-bit mode, but correspond to the input terminals D13, D14, and d12, respectively, in the 16-bit mode.

Here, input terminals D12, D13, D14, and D15 are not used to input valid data in the 12-bit mode. Accordingly, in the 16-bit mode, one or more of the output terminals from which the parallel to serial conversion circuit 200 acquires the 12 bits of the input parallel data in the 12-bit mode are used to receive one or more of the bits of the input parallel data that are not acquired in the 12-bit mode.

Furthermore, some of the input terminals to which valid data is input in both of the modes correspond to different output terminals in the different modes. For example, in the 16-bit mode, the input terminal D11 corresponds to the output terminals d2. In the 12-bit mode, on the other hand, the same input terminal D11 corresponds to the output terminals d0. In other words, the bit-swapping circuit 100 swaps the input parallel data such that one or more of the 1st to 12th bits of the input parallel data correspond to different bits of the bit-swapped parallel data in different modes The reset signal generation circuit 400 receives the clock signal CLK and generates the reset signal RSTZ that has Low period once in 16 clock cycles when the input parallel data width is 16 bits. While, the reset signal RSTZ has Low period once in 12 clock cycles when the input parallel data width is 12 bits.

Figure 4:
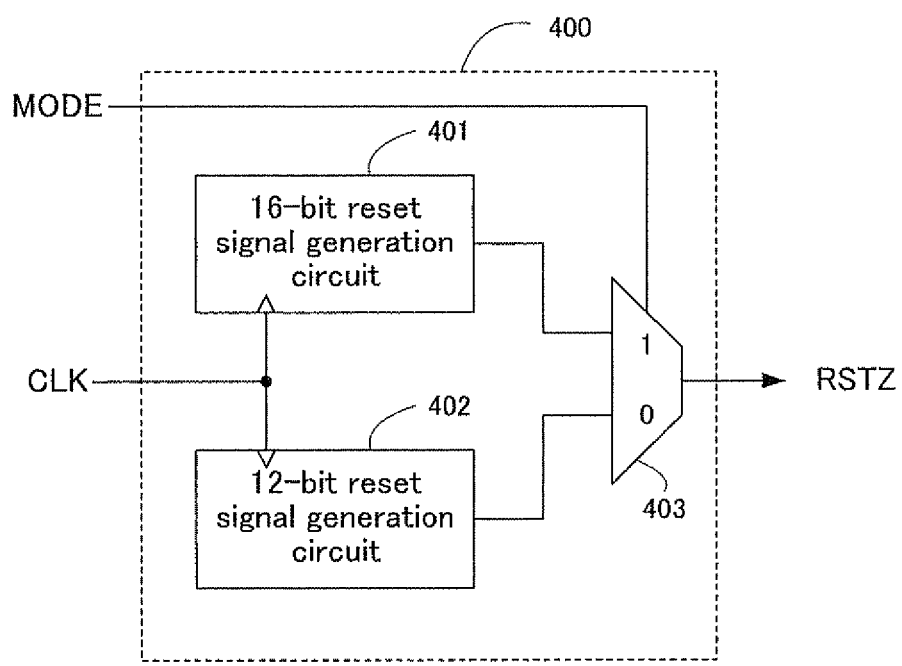
FIG. 4 is an exemplary circuit diagram of the reset signal generation circuit for input parallel data widths of 16/12 bits according to the first exemplary embodiment.

FIG. 4 shows an exemplary reset signal generation circuit 400 for 16/12-bit parallel data widths. The exemplary reset signal generation circuit 400 includes first reset signal generation circuit for 16-bit data width 401, second reset signal generation circuit for 12-bit data width 402, and a multiplexer 403. When the mode-setting signal MODE=1, an output of the first reset signal generation circuit 401 is selected as the reset signal RSTZ. When the mode-setting signal MODE=0, on the other hand, an output of the second reset signal generation circuit 402 is selected as the reset signal RSTZ.

The exemplary divided clock signal generation circuit 300 receives the clock signal CLK and generates divided clock signals. Specifically, the exemplary divided clock signal generation circuit 300 includes first to fourth toggle flip-flop (T-FF) circuits 301 to 304 each operates as a dividing circuit having a dividing ratio of 2. The first T-FF circuit 301 generates divided-by-2 clock signal div2_clk from the clock signal CLK. The second T-FF circuit 302 generates divided-by-4 clock signal div4_clk from the divided-by-2 clock signal div2_clk. The third T-FF circuit 303 generates divided-by-8 clock signal div8_clk from the divided-by-4 clock signal div4_clk. The fourth T-FF circuit 304 generates divided-by-16 clock signal div16_clk from the divided-by-8 clock signal div8_clk. These T-FF circuits 301 to 304 are initialized each time when the reset signal RSTZ generated by the reset signal generation circuit 400 becomes Low.

The divided-by 16 clock signal may be supplied as a parallel clock signal RCLK to various circuit blocks that process the parallel data, which may be integrated in the same semiconductor integrated circuit device that integrates the parallel to serial conversion apparatus.

The exemplary parallel to serial conversion circuit 200 has a tree-type structure. That is, a plurality of unit conversion circuits, each operates as a 2:1 parallel to serial conversion circuit by selecting one of two bits of the bit-swapped parallel data input from the output terminals d0 to d15 of the bit-swapping circuit 100, are connected in a form of a tree having four stages. That is, two of the bits selected by two of the unit conversion circuits in a previous stage are input to one of the unit conversion circuits in the next stage. Specifically, the exemplary parallel to serial conversion circuit 200 includes groups of flip-flop circuits div16_FF, div4_FF, div2_FF, a flip-flop circuit dout_FF, groups of multiplexers div8_mux, div4_mux, div2_mux, and a multiplexer dout_mux.

The group of flip-flop circuits div16_FF includes 16 flip-flop circuits that hold the data from the output terminals d0 to d15 of the bit-swapping circuit 100 at the rising edge of the divided clock signal div16_clk. The group of multiplexers div8_mux includes 8 multiplexers. Each of them selects an output from an upper one of two adjacent flip-flop circuits in the group of flip-flop circuits div16_FF when the divided clock signal div16_clk is Low, and selects an output from a lower one of two adjacent flip-flop circuits when the divided clock signal div16_clk is High.

The group of multiplexers div4_mux includes 4 multiplexers. Each of them selects an output from an upper one of two adjacent multiplexers in the group of multiplexers div8_mux when the divided clock signal div8_clk is Low, and selects an output from a lower one of two adjacent multiplexers when the divided clock signal div8_clk is High.

The group of flip-flop circuits div4_FF include 4 flip-flop circuits that hold outputs of respective multiplexers in the group of multiplexers div4_mux at the rising edge of the divided clock signal div4_clk. The group of multiplexers div2_mux includes 2 multiplexers. Each of them selects an output of an upper one of two adjacent flip-flop circuits in the group of flip-flop circuits div4_FF when the divided clock signal div4_clk is Low, and selects an output of a lower one of two adjacent flip-flop circuits when the divided clock signal div4_clk is High.

The group of flip-flops div2_FF includes two flip-flop circuits that hold outputs of respective multiplexers in the group of multiplexers div2_mux at the rising edge of the divided clock signal div2_clk. The multiplexer dout_mux selects an output of an upper one of the flip-flop circuits in the group of flip-flop circuits div2_FF when the divided clock signal div2_clk is Low, and selects an output of a lower one of the flip-flop circuits when the divided clock signal div2_clk is High. The flip-flop circuit dout_FF holds an output of the multiplexer dout_mux at the rising edge of the clock signal div_clk, which is the same signal as the clock signal CLK.

Figure 5:
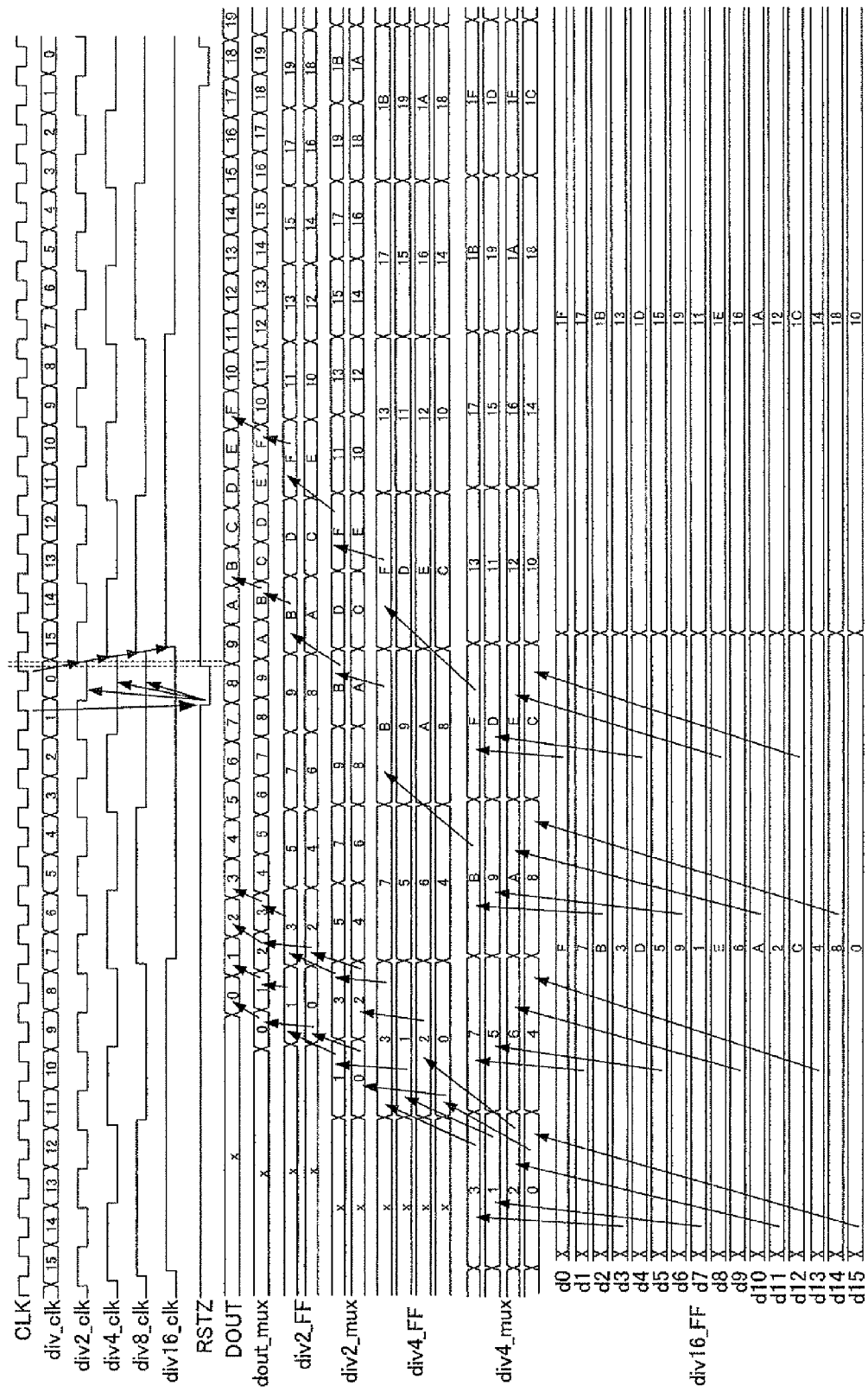
FIG. 5 is an exemplary timing chart of the first exemplary embodiment when the input parallel data width is 16 bits.
Figure 6:
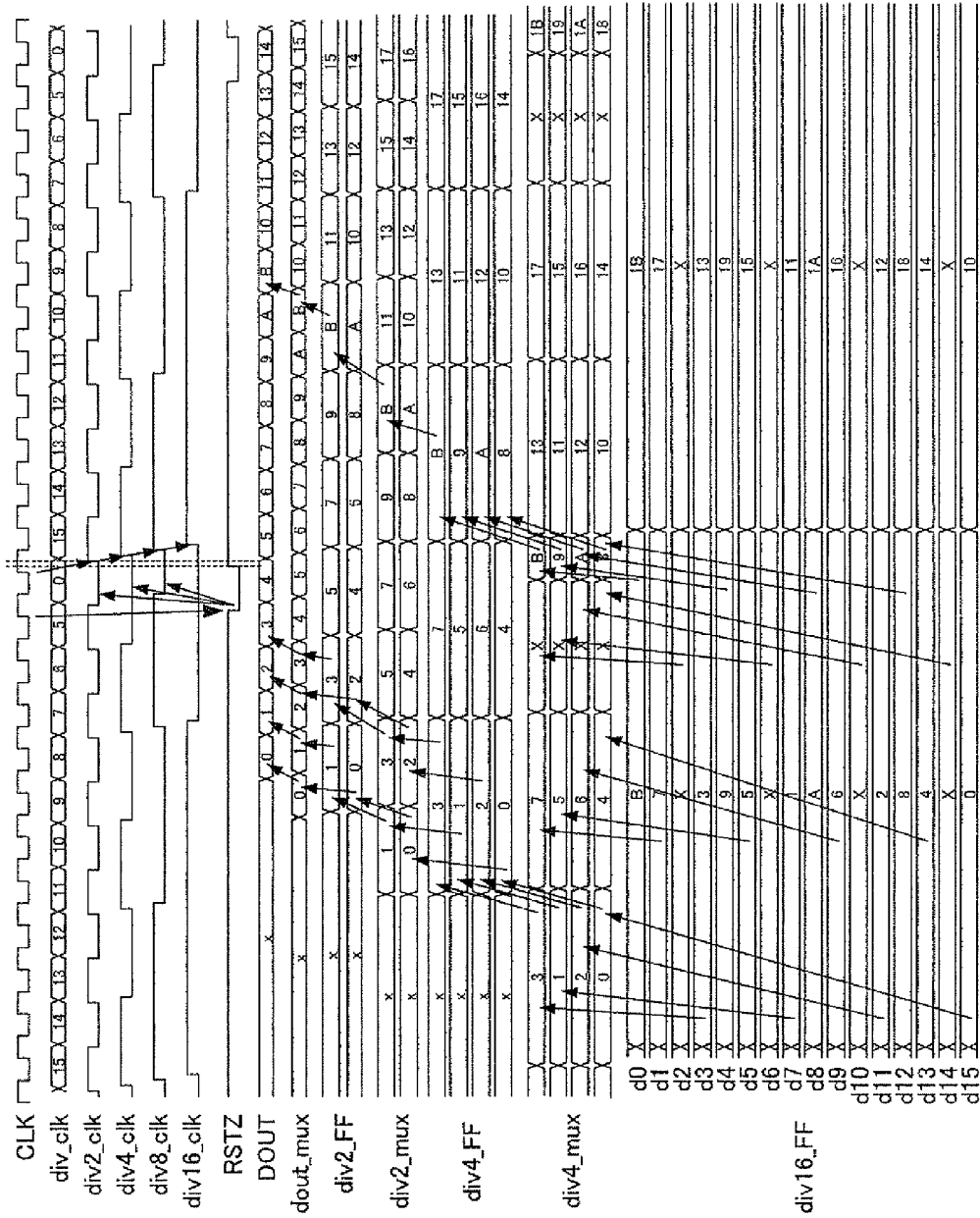
FIG. 6 is an exemplary timing chart of the first exemplary embodiment when the input parallel data width is 12 bits.

Next, parallel to serial conversion process of the exemplary parallel to serial conversion circuit 200 when the widths of the parallel data input to the parallel input terminals D0 to D15 are 16 and 12 bits, respectively, are explained. FIG. 5 shows a timing chart when the input parallel data has a width of 16 bits, and FIG. 6 shows a timing chart when the input parallel data has a width of 12 bits. The upper portions of FIGS. 5 and 6 show the clock signals CLK and div_clk and divided clock signals div2_clk, div8_clk, div16_clk, and the reset signal RSTZ.

The exemplary divided clock signal generation circuit 300 operates as a down counter. That is, the divided clock signals generated by the divided clock signal generation circuit 300 represent a count value of a down counter. The count value of the down counter, which is a 4-bit down counter in the example shown in FIG. 2, changes with a cycle of 16 clock cycles as 15→14→13→ . . . →2→1→0→15→14 when the reset signal RSTZ is kept High.

If the reset signal RSTZ negates, i.e., becomes Low, once in 16 clock cycles, the counter counts with a cycle of 16 clock cycles as shown in the timing chart of FIG. 5. Accordingly, the count value of the counter changes in synchronous with the clock signal div_clk as 15→14→13→ . . . →2→1→0→15→14 . . . , as shown in the timing chart of FIG. 5. If the reset signal RSTZ negates once in 12 clock cycles, on the other hand, the counter counts with a cycle of 12 clock cycles. That is, the count value of the counter changes as, by skipping the lower four values 4 to 1, 15→14→13→ . . . →6→5→0→15→14 as shown in the timing chart of FIG. 6.

FIGS. 5 and 6 further show, in the bottom to the middle portions thereof, the parallel to serial conversion process that the bits of the bit-swapped parallel data are successively acquired, arranged, and output as serial data from the serial output terminal DOUT in an order in accordance with the change of the count value. The bits of the bits-swapped parallel data are input from the output terminals d0 to d15 of the bit-swapping circuit 100, which are also used as input terminals or internal input terminals of the parallel to serial conversion circuit 200. Note that, the numbers shown in FIGS. 5 and 6 represent bits of the input parallel data before the swapping, which are input to, moved within, and output from the parallel to serial conversion circuit 200. Arrows in FIGS. 5 and 6 represents movements of some of the bits in the conversion circuit.

Specifically, the numbers shown in the timing charts for "div16_FF" represent the bits of the input parallel data that are held and output from the flip-flop circuits in the group of flip-flop circuits div16_FT, which receive the bits of the parallel data from respective internal input terminals d0 to d15. Similarly, the numbers shown in the timing charts for "div4_FF" and "div2_FF" represent the bits of the input parallel data that are output from the flip-flop circuits in the groups of flip-flop circuits div4_FF and div2_FF, respectively. The numbers shown in the timing charts for "div4_mux" and "div2_mux" represent the bits of the input parallel data output from the multiplexers in the groups of multiplexers div4_mux and div2_mux, respectively. Further, the numbers shown in the timing chart for "dout_mux" represent the bits of the input parallel data that are output from the multiplexer dout_mux, and the numbers shown in the timing chart for "DOUT" represent the bits of the input parallel data arranged in the output serial data.

In conventional parallel to serial conversion circuit, the order of serializing the parallel data, or the order of arranging parallel data bits in the serial data, is fixed by a specification. In the exemplary parallel to serial conversion circuit 200 according to this embodiment, on the contrary, the order is not fixed. That is, the exemplary parallel to serial conversion circuit 200, which performs conversion processes based on the divided clock signals having different cycles, arranges bits of received parallel data in different orders in different modes.

For example, as shown in FIGS. 5 and 6, the bit of parallel data input to the internal input terminal d0 is output to the serial output terminal DOUT as the 16th bit (F) of the serial data in the 16-bit mode, but is output as the 12th bit (B) of the serial data in the 12-bit mode. Further, the bit of parallel data input to the internal input terminal d2 is output as the 12th bit (B) of the serial data in the 16-bit mode. However, the data input to the internal input terminal d2 does not constitute any of the bits of the parallel data in the 12-bit mode and is not output to the serial output terminal DOUT.

Accordingly, the internal input terminals d0 to d15 of the parallel to serial conversion circuit 200 cannot be used to directly input parallel data having varying widths.

In order to address this problem, the exemplary parallel to serial conversion apparatus according to this embodiment provides the bit-swapping circuit 100 between the input terminals D0 to D15 of the parallel to serial conversion apparatus and the internal input terminals d0 to d15 of the parallel to serial conversion circuit 200. The bit-swapping circuit 100 swaps bits of input parallel data in accordance with the mode of the parallel to serial conversion apparatus, or the cycle of the reset signal RSTZ. Specifically, for example, the bit-swapping circuit 100 supplies the bit of input parallel data received at the input terminal of the conversion apparatus D15 to the internal input terminal d0 of the conversion circuit 200 in the 16-bit mode. In the 12-bit mode, on the other hand, the bit-swapping circuit 100 supplies the bit of input parallel data received at the input terminal of the conversion apparatus D11 to the internal input terminal d0 of the conversion circuit 200.

As a result, in the 16-bit mode, by inputting bits 0, 1, 2, E, F of a word of parallel data and, then, bits 10, 11, 12, . . . , 1E, 1F of a next word of the parallel data to the parallel input terminals D0, D1, D2, . . . , D14, D15, respectively, the parallel data is converted to serial data by arranging the bits of the parallel data in an order of 0, 1, 2, E, F, 10, 11, 12, . . . . That is, bits of parallel data input to the parallel input terminals D0, D1, . . . , D15 are arranged in the serial data in an order from the bit input to the lowest-numbered input terminal (D0) to the bit input to the highest-numbered input terminal (D15).

In the 12-bit mode, on the other hand, 12 of the 15 parallel input terminals from D0, or the input terminals D0, D1, . . , D11, are used to input bits of parallel data. By inputting bits 0, 1, 2, . . . , A, B of a word of parallel data and, then, bits 10, 11, 12, . . . , 1A, 1B of a next word of the parallel data to the parallel input terminals D0 to D11, respectively, the parallel data is converted to serial data by arranging the bits of the parallel data in an order of 0, 1, . . . , A, B, 10, 11, . . . . That is, bits of parallel data input to the parallel input terminals D0, D1, . . . , D11 are arranged in the serial data in the same order, i.e., in an order from the bit input to the lowest-numbered input terminal (D0) to the bit input to the highest-numbered input terminal (D12).

As explained above, providing the bit-swapping circuit 100 enables to convert parallel data having an arbitrary width to serial data by arranging the bits of parallel data in a fixed order independent of the width of the parallel data. Specifically, according to this exemplary embodiment, 1st to Meth bits of the parallel data input to 1st to Meth parallel input terminals are arranged in the serial data in an order from the 1st to the Meth bits. It is also possible to construct the bit-swapping circuit such that the 1st to M-th bits of the parallel data input to 1st to Meth parallel input terminals are arranged in an order from the Meth to the 1st bits in the serial data.

Note that, FIG. 13 of Patent document 3 proposes to use the same parallel-serial conversion section (parallel to serial conversion circuit) 501, which can operate with a dividing ratio determined in accordance with a dividing ratio setting signal 506, for converting parallel data having different widths. Thereby, an amount of designing works can be decreased, because parallel-serial converter (parallel to serial conversion apparatus) 500 for converting parallel data having different widths can be constructed by only designing one parallel-serial conversion section.

However, Patent document 3 proposes a technique to provide a parallel-serial converter that converts parallel data having a fixed width, which is determined when the converter is designed, by using the same parallel-serial conversion section. It does not provide a parallel to serial conversion apparatus similar to the exemplary embodiment of this application, i.e., a parallel to serial conversion apparatus that can convert parallel data having a width selected from two or more widths in accordance with a mode-setting signal. Note that, in the parallel-serial converter according to Patent document 3, the order of outputting bits of parallel data input to the parallel-serial conversion section does not change because the width of parallel data is fixed. Accordingly, the bit-swapping circuit is not necessary.

The exemplary bit-swapping circuit 100 shown in FIG. 3 swaps the bits of parallel data in two different ways in accordance with the parallel data widths of 12 and 16 bits. It is also possible to construct bit-swapping circuits in accordance with various different parallel data widths. It is further possible to construct bit-swapping circuits that can swap the bits of parallel data in three or more ways.

For example, FIG. 2 also shows correspondences between the input terminals D0 to D15 and the output terminals d0 to d15 in accordance with the parallel data width of 10 bits. The bit-swapping circuit shown in FIG. 3 may be modified to be able to swap the parallel data in accordance with parallel data widths of 16, 12, and 10 bits. For example, four 2:1 multiplexers 101 to 104 may be substituted with four 3:1 multiplexers, each for selecting one of three bits to output to corresponding one of the output terminals d0, d4, d8 and d12. Further, two 2:1 multiplexers may be added to select the bits output to the output terminals d1 and d9, respectively.

When the bit-swapping circuit 100 is modified to swap the bits of parallel data in accordance with three or more parallel data widths, the reset signal generation circuit 400 may also be modified to generate reset signals in accordance with the three or more parallel data widths. In order to set the modified bit-swapping circuit and reset signal generation circuit, mode-setting signal MODE having three or more values may be provided. A semiconductor integrated circuit that integrates the parallel to serial conversion apparatus may also integrate a mode-setting circuit that sets the value of the mode-setting signal MODE. For example, the mode-setting circuit may read data stored in one or more registers during an initializing period of the semiconductor integrated circuit and set the value of the mode-setting signal.

The exemplary parallel to serial conversion circuit 200 has a tree-type construction. Only a small portion of the conversion circuit 200 including the multiplexer dout_mux and the flip-flop circuit dout_FF connected to the output terminal DOUT operate at the maximum frequency. Other portions operate at lower frequencies.

It is possible to provide 8 flip-flop circuits that operate with the divided clock signal div8_clk between the group of multiplexers div8_mux and the group of multiplexers div4_mux. These fillip-flop circuits are not necessary and, thus, omitted in the exemplary embodiment shown in FIG. 2, because these portions operate with divided clock signals and have sufficient timing margins. As a result, the exemplary parallel to serial conversion apparatus shown in FIG. 2 requires reduced circuit area and consumes less power.

Similarly, only a small portion of the exemplary divided clock signal generation circuit 300 including the T-FF circuit 301, which is used as the first dividing circuit, operates at the maximum frequency. Furthermore, no unnecessary component is included. Accordingly, the exemplary divided clock signal generation circuit 300 can operate at higher frequencies and can be easily designed.

The exemplary parallel to serial conversion apparatus shown in FIG. 2 is constructed with the bit-swapping circuit 100, the tree-type parallel to serial conversion circuit 200, and the divided clock signal generation circuit 300. The exemplary conversion apparatus can convert parallel data with an arbitrary width to serial data by simply supplying the reset signal RSTZ to the divided clock signal generation circuit 300 without loosing the high-speed operation capability of the tree-type parallel to serial conversion circuit.

As shown in FIG. 2, an apparatus constructed with n-stage tree-type parallel to serial conversion circuit may most efficiently have $2^n$ parallel input terminals, but may set the number of parallel input terminals N within a range of $2^{n-1} < N \leq 2^n$.

The width of parallel data may be even numbers within a range of $2^{n-1} < M \leq 2^n$ such as 16, 12, and 10 as in the case of the exemplary embodiment shown in FIG. 2. However, the exemplary parallel to serial conversion apparatus may convert parallel data having widths equal to or less than $2^{n-1}$. Further, the exemplary parallel to serial conversion apparatus may be modified to convert parallel data having widths of odd numbers. In order to convert parallel data having widths of odd numbers, it is possible to reset the dividing circuits with, for example, a reset signal that becomes valid at a rising edge of the clock signal and invalid at the next falling edge of the clock signal. Accordingly, the width M of input parallel data may be set within a range of 2≦M≦N.

The exemplary parallel to serial conversion apparatus is constructed with the tree-type parallel to serial conversion circuit 200. In this case, the order of outputting bits of parallel data input to the internal input terminals of the parallel to serial conversion circuit changes depending on the cycle of the reset signal. Accordingly, the bit-swapping circuit 100 is required. The bit-swapping circuit 100 may also be required when different types of parallel to serial conversion circuits are utilized if the order of outputting bits of parallel data changes depending on the width of input parallel data.

The exemplary parallel to serial conversion apparatus shown in FIG. 2 resets the divided clock signal generation circuit 300 by using an asynchronous reset. It is also possible to utilize synchronous reset. In the exemplary divided clock signal generation circuit 300, all of the T-FF circuits 301 to 304 are reset to zero by the reset signal RSTZ. The T-FF circuits may be reset to different values, although re-designing of the bit-swapping circuit 100 may be required.

2nd Exemplary Embodiment

Figure 7:
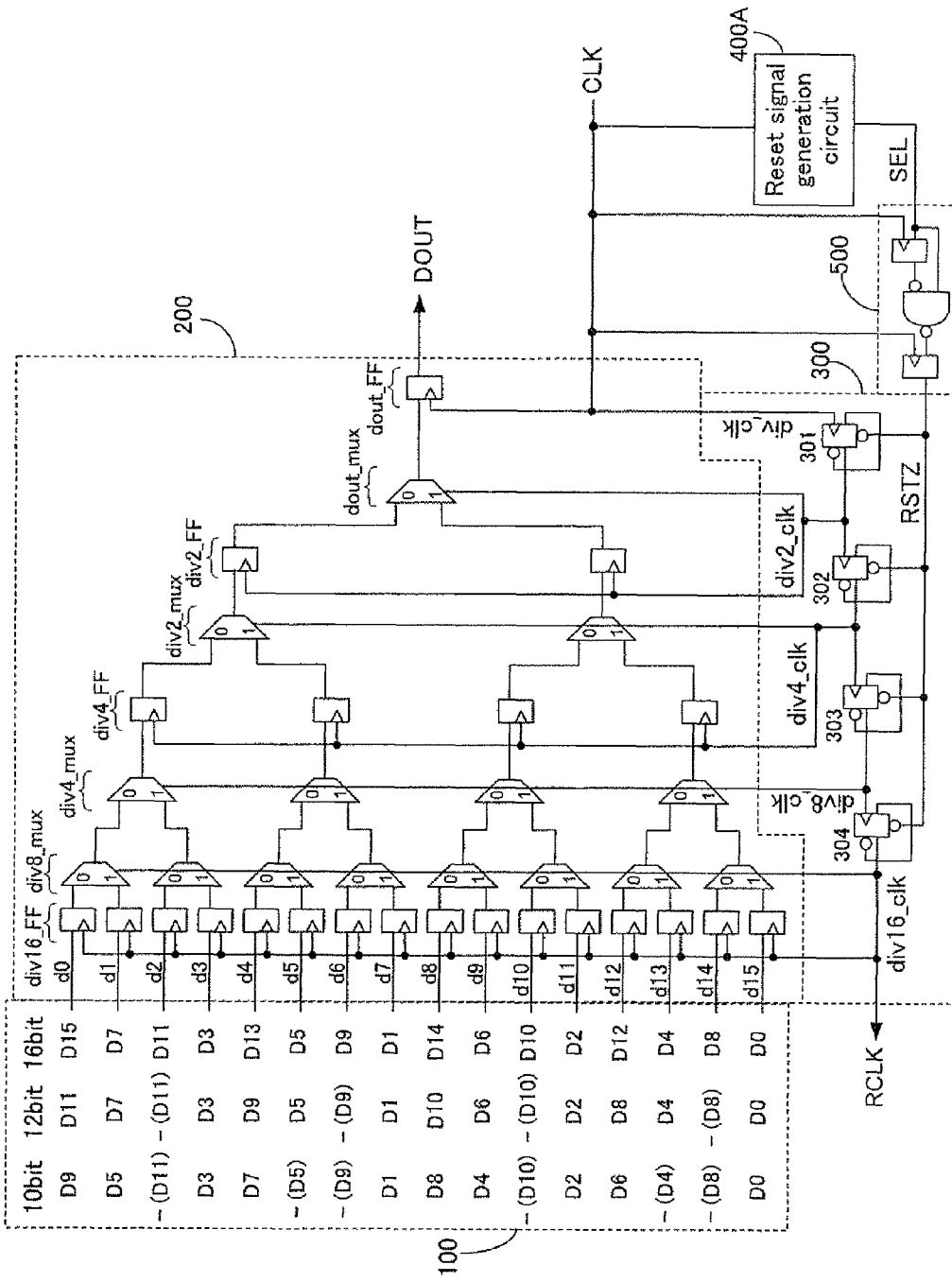
FIG. 7 is an exemplary circuit diagram of parallel to serial conversion apparatus according to second exemplary embodiment of this disclosure.

FIG. 7 shows circuit diagram of an exemplary parallel to serial conversion apparatus according to second exemplary embodiment of this disclosure.

In the exemplary embodiment shown in FIG. 2, the reset signal generation circuit 400 generates the reset signal RSTZ. In the exemplary embodiment shown in FIG. 7, on the other hand, a reset signal generation circuit 400A generates a signal SEL and an edge detection circuit 500 generates RSTZ signal, which is equivalent to the reset signal RSTZ of the first exemplary embodiment. Specifically, the edge detection circuit may detect rising edges of the signal SEL and generates the reset signal RSTZ.

Figure 8:
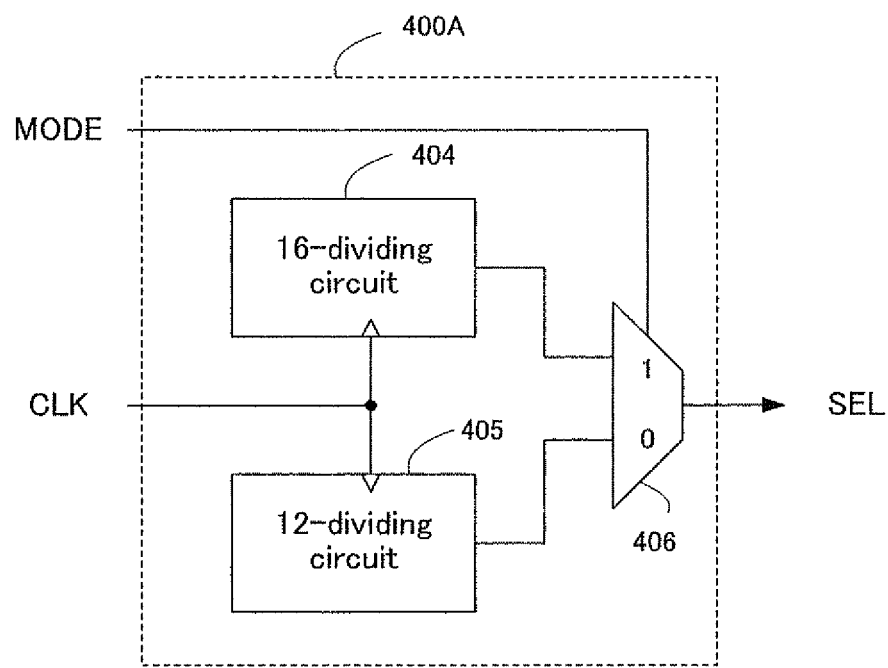
FIG. 8 is an exemplary circuit diagram of the reset signal generation circuit according to the second exemplary embodiment.

The reset signal generation circuit 400A for selecting 16/12-bit parallel data widths may be constructed with a 16-dividing circuit 404 that divides the clock signal CLK by a dividing ratio of 16, a 12-dividing circuit 405 that divides the clock signal CLK by a dividing ratio of 12, and a multiplexer 406 as shown in FIG. 8. The multiplexer 406 selects the output of the 16-dividing circuit 404 when the mode-setting signal MOD=1 and the output of the 12-dividing circuit 405 when the mode-setting signal MODE=0, respectively.

Figure 9:
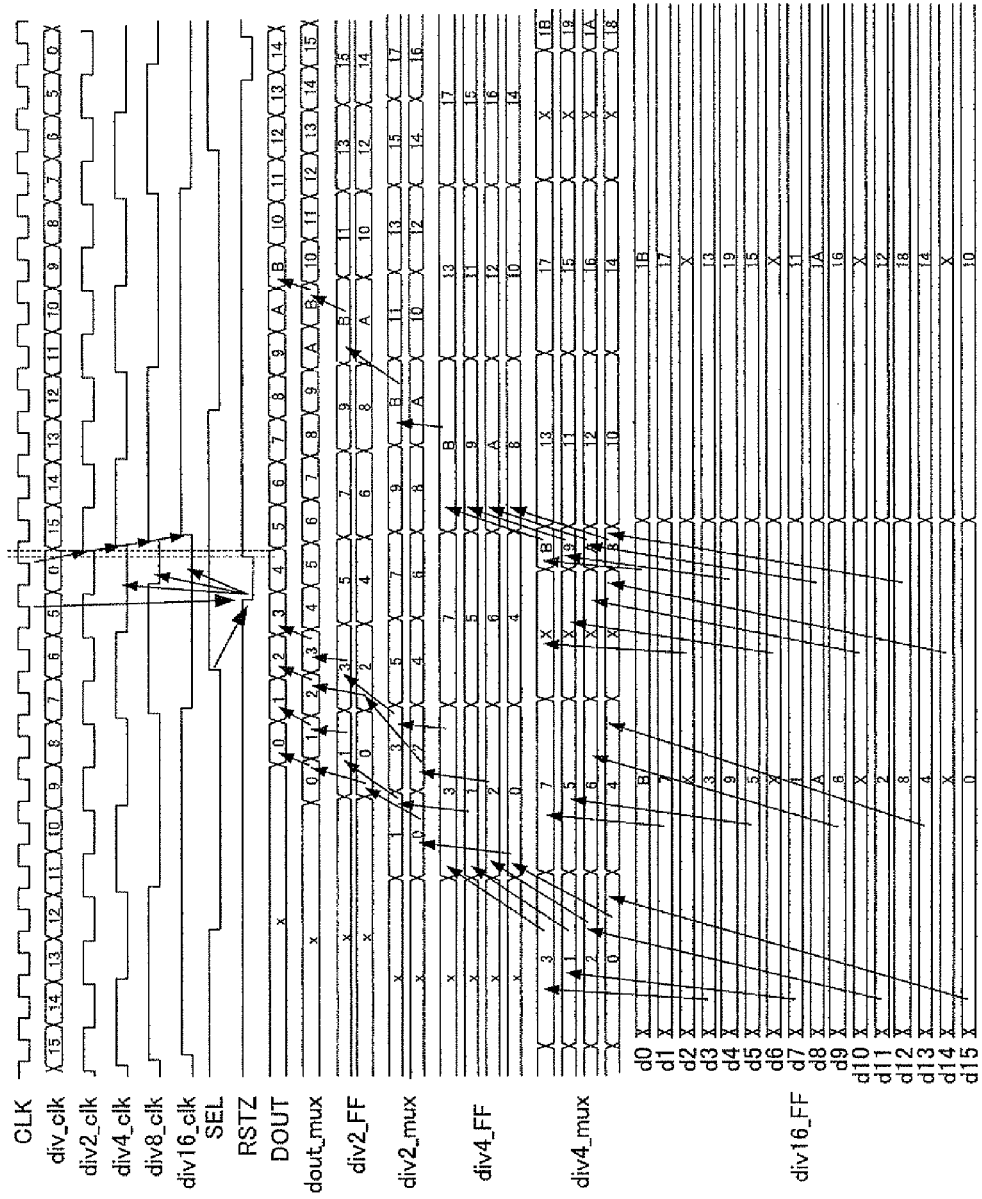
FIG. 9 is an exemplary timing chart of the second exemplary embodiment when the input parallel data width is 12 bits.

FIG. 9 shows a timing chart when the input parallel data has a width of 12 bits, which is essentially the same as the timing chart shown in FIG. 6 except that a waveform of the signal SEL is also shown. The signal SEL has a cycle of 12 clock cycles. The reset signal RSTZ becomes Low at the second rising edge of the clock signal after each rising edge of the signal SEL, and returns to High at the next rising edge of the clock signal.

As can be seen from FIG. 9, different from the reset signal RSTZ having narrow Low periods, the signal SEL has a 1:1 duty ratio. Accordingly, supplying the signal SEL to the edge detection circuit 500 does not require a high-speed buffer circuit even if the reset signal generation circuit 400A is positioned apart from the edge detection circuit 500. Further, the edge detection circuit 500 determines the precise timing of the Low period of the reset signal RSTZ in accordance with the edges of the clock signal CLK. As a result, timing design becomes easy.

What is claimed is:

1. A parallel to serial conversion apparatus having a first and a second mode, comprising:
a bit-swapping circuit that receives bits of input parallel data from parallel input terminals and generates bit-swapped parallel data by swapping the bits of the input parallel data; and
a parallel to serial conversion circuit having internal input terminals that receives respective bits of the bit-swapped parallel data, the parallel to serial conversion circuit acquiring M1 bits of the bit-swapped parallel data received at M1 of the internal input terminals in the first mode and M2 bits of the bit-swapped parallel data received at M2 of the internal input terminals in the second mode, where each of M1 and M2 is an integer and 2≦M2<M1;
wherein:
the parallel to serial conversion circuit generates serial data by arranging the acquired bits of the bit-swapped parallel data in a first specified order in the first mode and in a second specified order, different from the first specified order, in the second mode; and
the bit-swapping circuit swaps the bits of the input parallel data in a first way in the first mode and in a second way, different from the first way, in the second mode such that the parallel to serial conversion circuit acquires 1st to M1-th and 1st to M2-th bits of the input parallel data in the first and second modes, respectively, and arranges the acquired bits of the input parallel data in a same order independent of the modes.

2. The parallel to serial conversion apparatus according to claim 1, wherein the bit-swapping circuit swaps the bits of the input parallel data such that, in the first mode, one or more of the M2 of the internal input terminals receives one or more of the bits of the input parallel data that the parallel to serial conversion circuit does not acquire in the second mode.

3. The parallel to serial conversion apparatus according to claim 1, wherein the bit-swapping circuit includes a multiplexer that receives two of the bits of the input parallel data that are selected as one of the bits of the bit-swapped parallel data in the first and second modes, respectively.

4. The parallel to serial conversion apparatus according to claim 1, wherein:
the parallel to serial conversion circuit includes 1st to n-th stages each including $2^{n-k}$ unit conversion circuits, where n is an integer greater than 1 and M1≦$2^n$, and k=1, 2, 3, n, each of the unit conversion circuits in the 1st to n−1-th stages receives two of the bits of the bit-swapped parallel data and supplies one of the received bits to a next one of the stages and the unit conversion circuit in the n-th stage receives two of the bits of the bit-swapped parallel data and supplies one of the received bits to an output terminal that outputs the serial data in synchronous with a clock signal having a clock cycle.

5. The parallel to serial conversion apparatus according to claim 4, further comprising:
divided clock signal generation circuit including 1st to n-th diving circuits each having a dividing ratio of 2, the 1st to n-th dividing circuits successively divide the clock signal to generate 1st to n-th divided clock signals; and
a reset signal generation circuit that generates a reset signal that resets the 1st to n-th diving circuits at a processing cycle equal to M1 and M2 times the clock cycle in the first and the second modes, respectively, so that the 1st to n-th diving circuits generates the 1st to n-th divided clock signals that are reset at the processing cycle as 1st to n-th processing signals to be supplied to the 1st to n-th stages, respectively, of the parallel to serial conversion circuit.

6. The parallel to serial conversion apparatus according to claim 5, wherein the reset signal generation circuit includes:
M1-dividing circuit and M2-dividing circuit that divide the clock signal by factors of M1 and M2, respectively, to generate M1- and M2-divided clock signals; and
an edge detection circuit that detects edges of one of the M1- and M2-divided clock signals selected in accordance with the mode to generated the reset signal.

7. A parallel to serial conversion apparatus comprising:
a bit-swapping circuit that receives bits of input parallel data from parallel input terminals and generates bit-swapped parallel data by swapping the bits of the input parallel data;
a parallel to serial conversion circuit; and
a parallel-data-width setting circuit that receives a clock signal having a clock cycle and a mode-setting signal, the parallel-data-width setting circuit generates a processing signal to be supplied to the parallel to serial conversion circuit such that the processing signal has a processing cycle equal to one of M1 and M2 times the clock cycle determined in accordance with a value of the mode-setting signal, where each of M1 and M2 is an integer and $2 \leq M2 < M1$,
wherein:
the parallel to serial conversion circuit acquires M1 or M2 bits of the bit-swapped parallel data and outputs the acquired bits in a specified order in accordance with the processing cycle from an output terminal in synchronous with the clock signal as serial data; and
the bit-swapping circuit swaps the bits of the input parallel data in accordance with the value of the mode-setting signal such that, by acquiring the M1 or M2 bits of the bit-swapped parallel data and outputting the acquired bits in the specified order, the parallel to serial conversion circuit acquires 1st to M1-th or M2-th bits of the input parallel data and outputs the acquired bits of the input parallel data in a same order independent of the value of the mode-setting signal from the output terminal.

8. The parallel to serial conversion apparatus according to claim 7, wherein the bit-swapping circuit swaps the bits of the input parallel data such that one or more of the 1st to M2-th bits of the input parallel data correspond to different bits of the bit-swapped parallel data when the value of the mode-setting signal is different.

9. The parallel to serial conversion apparatus according to claim 7, wherein the bit-swapping circuit includes a multiplexer that receives two of the bits of the input parallel data and selects, in accordance with the value of the mode-setting signal, one of the received bits of the input parallel data as one of the bits of the bit-swapped parallel data.

10. The parallel to serial conversion apparatus according to claim 7, wherein:
the parallel to serial conversion circuit includes 1st to n-th stages each including $2^{n-k}$ unit conversion circuits, where n is an integer greater than 1 and $M1 \leq 2^n$, and k=1, 2, 3, . . . , n, each of the unit conversion circuits in the 1st to n−1-th stages receives two of the bits of the bit-swapped parallel data and supplies one of the received bits to a next one of the stages and the unit conversion circuit in the n-th stage receives two of the bits of the bit-swapped parallel data and supplies one of the received bits to the output terminal.

11. The parallel to serial conversion apparatus according to claim 10, wherein the parallel-data-width setting circuit includes:
divided clock signal generation circuit including 1st to n-th diving circuits each having a dividing ratio of 2, the 1st to n-th dividing circuits successively divide the clock signal to generate 1st to n-th divided clock signals; and
a reset signal generation circuit that generates a reset signal that resets the 1st to n-th diving circuits at the processing cycle so that the 1st to n-th diving circuits generates the 1st to n-th divided clock signals that are reset at the processing cycle as 1st to n-th processing signals to be supplied to the 1st to n-th stages, respectively, of the parallel to serial conversion circuit.

12. The parallel to serial conversion apparatus according to claim 10, wherein the reset signal generation circuit includes:
M1-dividing circuit and M2-dividing circuit that divide the clock signal by factors of M1 and M2, respectively, to generate M1- and M2-divided clock signals; and
an edge detection circuit that detects edges of one of the M1- and M2-divided clock signals selected in accordance with the value of the mode-setting signal to generated the reset signal.

13. A method of converting parallel data to serial data, comprising:
receiving a mode-setting signal having one of a first and a second value;
receiving bits of input parallel data from parallel input terminals and generating bit-swapped parallel data by swapping the bits of the input parallel data; and
receiving bits of the bit-swapped parallel data from respective internal input terminals of a parallel to serial conversion circuit and generating serial data by (1) acquiring M1 bits of the bit-swapped parallel data received from M1 of the internal input terminals and arranging the acquired bits of the bit-swapped parallel data in a first specified order when the mode-setting signal has the first value and (2) acquiring M2 bits of the bit-swapped parallel data received from M2 of the internal input terminals and arranging the acquired bits of the bit-swapped parallel data in a second specified order, different from the first specified order, when the mode-setting signal has the second value, where each of M1 and M2 is an integer and $2 \leq M2 < M1$,
wherein the swapping swaps the bits of the input parallel data in a first way when the mode-setting signal has the first value and in a second way, different from the first way, when the mode-setting signal has the second value, such that the parallel to serial conversion circuit acquires 1st to M1-th and 1st to M2-th bits of the input parallel data when the mode-setting signal has the first and second values, respectively, and arranges the acquired bits of the input parallel data in a same order independent of the value of the mode-setting signal.

14. The method according to claim 13, wherein the swapping is performed such that, when the mode-setting signal has the first value, one or more of the M2 of the internal input terminals receives one or more of the bits of the input parallel data that the parallel to serial conversion circuit does not acquire in the second mode.

15. The method according to claim 13, wherein:
the parallel to serial conversion circuit includes 1st to n-th stages each including $2^{n-k}$ unit conversion circuits, where n is an integer greater than 1 and $M1 \leq 2^n$, and k=1, 2, 3, . . . , n, each of the unit conversion circuits in the 1st to n−1-th stages receives two of the bits of the bit-swapped parallel data and supplies one of the received bits to a next one of the stages and the unit conversion circuit in the n-th stage receives two of the bits of the bit-swapped parallel data and supplies one of the received bits to an output terminal that outputs the serial data in synchronous with a clock signal having a clock cycle.

16. The method according to claim 15, further comprising:
successively dividing the clock signal in 1st to n-th diving circuits each having a dividing ratio of 2 to generate 1st to n-th divided clock signals; and
resetting the 1st to n-th diving circuits at a processing cycle equal to M1 and M2 times the clock cycle when the mode-setting signal has the first and the second values, respectively, so that the 1st to n-th diving circuits generates the 1st to n-th divided clock signals that are reset at the processing cycle as 1st to n-th processing signals to be supplied to the 1st to n-th stages, respectively, of the parallel to serial conversion circuit.

17. A method of converting parallel data to serial data, comprising:
receiving bits of input parallel data from parallel input terminals and generating bit-swapped parallel data by swapping the bits of the input parallel data;
receiving a clock signal having a clock cycle and a mode-setting signal and generating a processing signal to be supplied to a parallel to serial conversion circuit such that the processing signal has a processing cycle equal to one of M1 and M2 times the clock cycle determined in accordance with a value of the mode-setting signal, where each of M1 and M2 is an integer and $2 \leqq M2 \leqq M1$; and
acquiring M1 or M2 bits of the bit-swapped parallel data in the parallel to serial conversion circuit and outputting the acquired bits in a specified order in accordance with the processing cycle from an output terminal in synchronous with the clock signal as serial data,
wherein the swapping is performed in accordance with the value of the mode-setting signal such that, by acquiring the M1 or M2 bits of the bit-swapped parallel data and outputting the acquired bits in the specified order, the parallel to serial conversion circuit acquires 1st to M1-th or M2-th bits of the input parallel data and outputs the acquired bits of the input parallel data in a same order independent of the value of the mode-setting signal from the output terminal.

18. The method according to claim 17, wherein the swapping is performed such that one or more of the 1st to M2-th bits of the input parallel data correspond to different bits of the bit-swapped parallel data when the value of the mode-setting signal is different.

19. The method according to claim 17, wherein:
the parallel to serial conversion circuit includes 1st to n-th stages each including $2^{n-k}$ unit conversion circuits, where n is an integer greater than 1 and $M1 \leqq 2^n$, and k=1, 2, 3, ..., n, each of the unit conversion circuits in the 1st to n−1-th stages receives two of the bits of the bit-swapped parallel data and supplies one of the received bits to a next one of the stages and the unit conversion circuit in the n-th stage receives two of the bits of the bit-swapped parallel data and supplies one of the received bits to the output terminal.

20. The method according to claim 19, wherein the generating of the processing signal includes:
successively dividing the clock signal in 1st to n-th dividing circuits each having a dividing ratio of 2 to generate the 1st to n-th divided clock signals; and
resetting the 1st to n-th diving circuits at the processing cycle so that the 1st to n-th diving circuits generates the 1st to n-th divided clock signals that are reset at the processing cycle as 1st to n-th processing signals to be supplied to the 1st to n-th stages, respectively, of the parallel to serial conversion circuit.

* * * * *